United States Patent
Lozhkin

(10) Patent No.: US 9,444,412 B2
(45) Date of Patent: Sep. 13, 2016

(54) DISTORTION COMPENSATION APPARATUS AND METHOD THEREFOR

(71) Applicant: FUJITSU LIMITED, Kawasaki-shi, Kanagawa (JP)

(72) Inventor: Alexander Nikolaevich Lozhkin, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 65 days.

(21) Appl. No.: 14/446,569

(22) Filed: Jul. 30, 2014

(65) Prior Publication Data

US 2015/0097618 A1     Apr. 9, 2015

(30) Foreign Application Priority Data

Oct. 9, 2013   (JP) ................................ 2013-211626

(51) Int. Cl.
| | |
|---|---|
| H03F 1/26 | (2006.01) |
| H03F 1/32 | (2006.01) |
| H03G 3/30 | (2006.01) |
| H03F 3/24 | (2006.01) |

(52) U.S. Cl.
CPC .............. *H03F 1/3247* (2013.01); *H03F 3/24* (2013.01); *H03G 3/3042* (2013.01); *H03F 1/26* (2013.01); *H03F 1/3241* (2013.01); *H03F 2201/3227* (2013.01); *H03F 2201/3231* (2013.01)

(58) Field of Classification Search
CPC .. H03F 1/3247; H03F 1/3241; H03F 1/3229; H03F 2201/3233; H03F 1/3276
USPC ............... 330/149; 375/296; 455/63.1, 114.3
See application file for complete search history.

(56) References Cited

U.S. PATENT DOCUMENTS

| | | | | |
|---|---|---|---|---|
| 2008/0068080 A1* | 3/2008 | Miyatani | ................ | G01R 23/20 330/149 |
| 2008/0197925 A1* | 8/2008 | Furuta | ................... | H03F 1/3247 330/149 |
| 2009/0115513 A1* | 5/2009 | Hongo | .................. | H03F 1/3247 330/149 |
| 2012/0256687 A1* | 10/2012 | Davies | .................. | H03F 1/3247 330/149 |
| 2013/0040587 A1* | 2/2013 | Ishikawa | ............... | H03F 1/3247 330/149 |
| 2014/0254716 A1* | 9/2014 | Zhou | ..................... | H03F 1/3247 375/296 |

FOREIGN PATENT DOCUMENTS

| | | |
|---|---|---|
| JP | 2001-251148 | 9/2001 |
| JP | 2007-37110 | 2/2007 |
| JP | 2009-290384 | 12/2009 |
| JP | 2010-103834 | 5/2010 |

OTHER PUBLICATIONS

Lei Ding et al., "A Robust Digital Baseband Predistorter Constructed Using Memory Polynomials", IEEE Transactions on Communications, vol. 52, No. 1, Jan. 2004, pp. 159-165.

* cited by examiner

*Primary Examiner* — Khanh V Nguyen
(74) *Attorney, Agent, or Firm* — Fujitsu Patent Center

(57) ABSTRACT

A distortion compensation apparatus includes a pre-distorter, a gain control unit, and a learning unit. The pre-distorter adds distortion according to compensation coefficients to individual input signals prior to the input signals being input to a power amplifier. The gain control unit applies gain control to individual feedback signals fed back from the power amplifier according to a maximum level of the feedback signals within a time frame. The learning unit updates the compensation coefficients used by the pre-distorter, using the feedback signals subjected to the gain control by the gain control unit.

5 Claims, 9 Drawing Sheets

DISTORTION COMPENSATION APPARATUS AND METHOD THEREFOR

CROSS-REFERENCE TO RELATED APPLICATION

This application is based upon and claims the benefit of priority of the prior Japanese Patent Application No. 2013-211626, filed on Oct. 9, 2013, the entire contents of which are incorporated herein by reference.

FIELD

The embodiments discussed herein are related to an apparatus and a method for compensating distortion.

BACKGROUND

In a wireless communication system, a wireless transmission apparatus for transmitting wireless signals is provided with a power amplifier for amplifying the transmission signals. The power amplifier exhibits a linear characteristic where, in a smaller amplitude region of an input signal, the amplitude of the input signal has a roughly linear relationship with the amplitude of a corresponding output signal (the region may be hereinafter referred to as the "linear region"). On the other hand, the power amplifier exhibits a nonlinear characteristic where, in a larger amplitude region of the input signal, the amplitude of the input signal has a nonlinear relationship with the amplitude of the output signal (the region may be hereinafter referred to as the "nonlinear region"). In view of the efficient use of the power amplifier, it is often the case that the power amplifier is operated not only for the linear region but also for the nonlinear region.

However, nonlinear distortion of a transmission signal due to the nonlinear amplification characteristic of the power amplifier may reduce quality in wireless communication, for example, causing power leakage from an intended frequency range into adjacent frequency ranges. In view of this, some wireless transmission apparatuses are designed to carry out pre-distortion compensation as a means of linearizing the nonlinear amplification characteristic of the power amplifier. For the pre-distortion compensation, such a wireless transmission apparatus is provided with a pre-distorter functioning as a linearizer.

The pre-distorter adds nonlinear distortion having an inverse characteristic to the nonlinear characteristic of the power amplifier to a transmission signal prior to the transmission signal being input to the power amplifier. By feeding the transmission signal with the inverse-characteristic nonlinear distortion added thereto to the power amplifier, it is possible to suppress nonlinear distortion of the transmission signal after being amplified, which nonlinear distortion is generated with respect to the transmission signal prior to the transmission signal being input to the pre-distorter. The pre-distorter nonlinearly changes the amplitude of the transmission signal to be fed to the power amplifier by, for example, applying a compensation coefficient according to the amplitude of the transmission signal to the transmission signal (for example, multiplying the transmission signal by the compensation coefficient). Such compensation coefficients each corresponding to the magnitude of the amplitude of the transmission signal may be stored, for example, in a lookup table (LUT).

It is not easy to accurately estimate in advance the inverse characteristic to the nonlinear characteristic of the power amplifier. Therefore, in the pre-distortion compensation, the compensation coefficients used by the pre-distorter may be adaptively updated as the power amplifier is being operated. For example, the wireless transmission apparatus feeds back output signals of the power amplifier, and estimates appropriate compensation coefficients based on the feedback signals and corresponding transmission signals prior to the transmission signals being input to the power amplifier, which compensation coefficients are then set in the pre-distorter.

Note that a distortion compensation apparatus has been proposed which corrects a compensation coefficient in such a manner that the power of a transmission signal subjected to distortion compensation by a pre-distorter does not exceed the dynamic range of a digital analog converter (DAC). The distortion compensation apparatus is designed to calculate the compensation coefficient based on a feedback signal and then compare, before storing the calculated compensation coefficient in a memory, an estimate of the power of the transmission signal to be output from the pre-distorter in the case of using the compensation coefficient against predetermined upper limit power. If the estimate exceeds the upper limit power, the distortion compensation apparatus corrects the calculated compensation coefficient in such a manner as to reduce the magnitude thereof while maintaining its phase before storing it in the memory.

In addition, a digital pre-distortion system has been proposed in which an input signal is clipped before being fed into a pre-distorter so as to reduce the peak-to-average power ratio of the signal.

In addition, a distortion compensation circuit has been proposed which limits the amplitude of transmission signals before feeding the transmission signals into a pre-distorter so that the amplitude of the transmission signals subjected to distortion compensation does not exceed a saturation level of a power amplifier. The distortion compensation circuit calculates a threshold based on compensation coefficients stored in a memory, and determines whether to limit the amplitude of each of the transmission signals by comparing the calculated threshold and the power of the transmission signal.

Further, a distortion compensation apparatus has been proposed in which an auto gain control (AGC) loop including an attenuation circuit is provided in a digital pre-distorter (DPD) loop including a distortion compensation circuit, an amplifier circuit, and a distortion detection circuit. To prevent operational instability caused by the double-loop structure including the DPD loop and the AGC loop, the distortion compensation apparatus normalizes compensation coefficients when updating the compensation coefficients in such a manner that the gain of the DPD loop becomes 1.

Japanese Laid-open Patent Publication No. 2001-251148
Japanese Laid-open Patent Publication No. 2007-37110
Japanese Laid-open Patent Publication No. 2009-290384
Japanese Laid-open Patent Publication No. 2010-103834

In general, an amplification factor in the nonlinear region of the power amplifier is smaller than an ideal amplification factor for the case where the amplification characteristic is linearized. Therefore, when the pre-distorter is being trained, the maximum amplitude of feedback signals is smaller than that of corresponding input signals in an early stage of the training where compensation coefficients corresponding to the nonlinear region have yet to become sufficiently large. That is, the dynamic range of the feedback signals is smaller than that of the input signals.

A distortion compensation apparatus learns compensation coefficients based on such feedback signals. Therefore, in the early stage of the training, not much learning takes place with respect to the higher amplitude side of the dynamic range of input signals, thus leaving an unlearned region. On the other hand, as the training progresses, compensation coefficients become larger in order from the lower amplitude side of the nonlinear region, thereby gradually increasing the maximum amplitude of the feedback signals and thus narrowing the unlearned region. Eventually, the dynamic range of the feedback signals matches that of the input signals, leaving no unlearned region, and thus the learning of compensation coefficients with respect to the entire dynamic range of the input signals is completed.

However, if the learning of compensation coefficients proceeds in the above-described manner, the unlearned region exists until the middle of the training, and therefore the training needs a long period of time to obtain highly accurate compensation coefficients for the entire range of the input signals.

SUMMARY

According to one embodiment, there is provided a distortion compensation apparatus for compensating nonlinear distortion of a power amplifier. The distortion compensation apparatus includes a pre-distorter configured to add distortion according to compensation coefficients to individual input signals prior to the input signals being input to the power amplifier; a gain control unit configured to apply gain control to individual feedback signals fed back from the power amplifier according to a maximum level of the feedback signals within a time frame; and a learning unit configured to update the compensation coefficients used by the pre-distorter, using the feedback signals subjected to the gain control.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Embodiments are described below with reference to the accompanying drawings.

(a) First Embodiment

Figure 1:
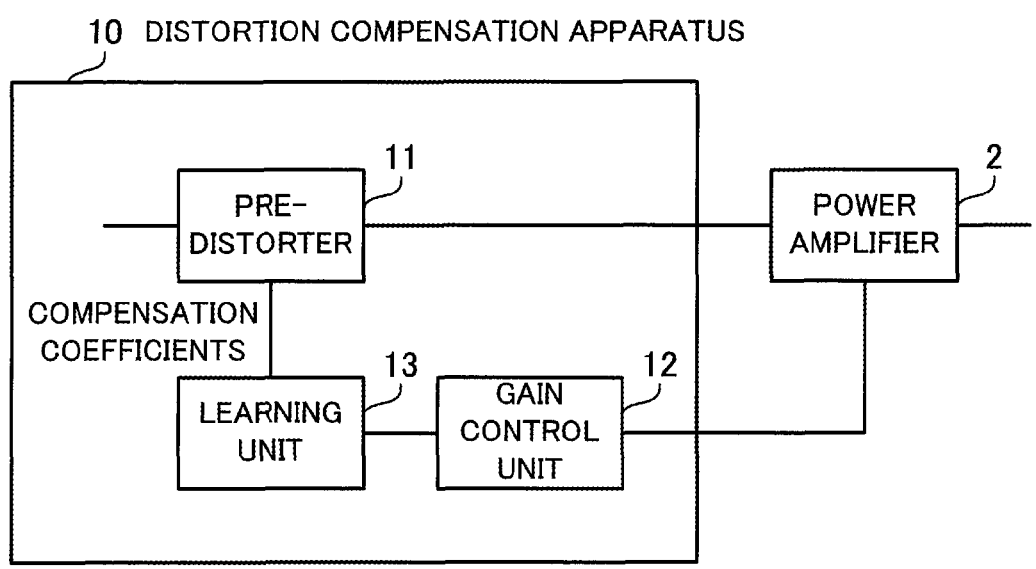
FIG. 1 illustrates a distortion compensation apparatus according to a first embodiment.

FIG. 1 illustrates a distortion compensation apparatus according to a first embodiment. A distortion compensation apparatus 10 of the first embodiment compensates nonlinear distortion of a power amplifier 2. The nonlinear distortion is found in signals output from the power amplifier 2, occurring due to the relationship between the input amplitude and the output amplitude (amplification characteristic) of the power amplifier 2 being nonlinear. The power amplifier 2 may be a high power amplifier (HPA). The power amplifier 2 and the distortion compensation apparatus 10 are installed, for example, in a wireless transmission apparatus for transmitting wireless signals. Examples of the wireless transmission apparatus include a wireless base station, a wireless relay apparatus, and a wireless terminal.

The distortion compensation apparatus 10 includes a pre-distorter 11, a gain control unit 12, and a learning unit 13. The pre-distorter 11 adds distortion according to a compensation coefficient to each input signal prior to the input signal being input to the power amplifier 2. The distortion added by the pre-distorter 11 preferably has an inverse characteristic to the nonlinear characteristic of the power amplifier 2 so as to cancel out the nonlinear distortion generated by the power amplifier 2. Compensation coefficients used by the pre-distorter 11 are calculated by training, as described later. For example, the pre-distorter 11 acquires a compensation coefficient corresponding to the amplitude of each input signal from a lookup table in which multiple amplitude levels are associated with multiple compensation coefficients, and applies the acquired compensation coefficient to the input signal (for example, multiplies the input signal by the compensation coefficient).

The gain control unit 12 acquires feedback signals fed back from the power amplifier 2, and applies gain control to each of the feedback signals and provides the resultant signals to the learning unit 13. A gain applied to each of the feedback signals is adjusted according to a maximum level of the feedback signals within a time frame. In order to make the gain variable, the gain control unit 12 may include a variable amplifier or a variable attenuator. For example, the gain control unit 12 detects a maximum level of feedback signals within a time frame and a maximum level of input signals prior to the input signals being input to the pre-distorter 11 within the time frame. Subsequently, the gain control unit 12 determines a gain to be applied to the feedback signals within the time frame, based on the maximum level of the feedback signals and the maximum level of the input signals.

In an early stage of training to be described later, the maximum level of the feedback signals is smaller than the maximum level of the input signals. Therefore, for example, the gain control unit 12 increases the amplitude of each feedback signal by making the gain larger than 1 so that the maximum level of the feedback signals becomes close to the maximum level of the input signals. Preferably, the gain control unit 12 determines a ratio of the maximum level of the input signals to that of the feedback signals as the gain, thereby matching the maximum levels of the feedback signals and the input signals. Note that, as an index indicating the "levels" of the feedback signals and the input signals, amplitude, power, or the like may be used.

During the training of the pre-distorter 11, the learning unit 13 repeatedly updates compensation coefficients used by the pre-distorter 11, using feedback signals subjected to gain control by the gain control unit 12. If a longer time is spent on the training, the accuracy of the compensation coefficients becomes higher. When the learning unit 13 updates compensation coefficients during the training, the pre-distorter 11 carries out distortion compensation using the updated compensation coefficients, and the power amplifier 2 amplifies input signals to which distortion has been added according to the updated compensation coefficients. In the case of continuing the training, the learning unit 13 further updates the compensation coefficients using feedback signals obtained after the last update. At this point, the gain control unit 12 may apply, to the feedback signals, a gain different from a previous one (i.e., a gain for the previous time frame).

As architecture for calculating compensation coefficients, for example, an indirect learning architecture is used. In the indirect learning architecture, the learning unit 13 tries to compensate distortion of each feedback signal subjected to gain control by the gain control unit 12 in such a manner that the amplitude or the phase of the feedback signal comes close to that of a corresponding input signal having passed through the pre-distorter 11. That is, the learning unit 13 calculates errors between individual signals generated by applying current compensation coefficients (currently used by the pre-distorter 11) to the feedback signals and corresponding input signals having passed through the pre-distorter 11, and corrects the compensation coefficients based on the errors. In this case, it may be said that the learning unit 13 is provided with a post-distorter. The leaning unit 13 copies, to the pre-distorter 11, the compensation coefficients learned with the use of the feedback signals.

Assuming here that no gain control by the gain control unit 12 is applied, the maximum amplitude of the feedback signals is smaller than that of the corresponding input signals input to the pre-distorter 11 in an early stage of the training. This is because an amplification factor in the nonlinear region of the power amplifier 2 is smaller than an ideal amplification factor for the case where the amplification characteristic is linearized. That is, in the early stage of the training, the dynamic range of the feedback signals is smaller than that of the input signals input to the pre-distorter 11.

In that case, in the early stage of the training, the learning unit 13 learns compensation coefficients not for the entire dynamic range of the input signals but for only a part of the dynamic range (a part corresponding to the dynamic range of the feedback signals). An unlearned region of the dynamic range of the input signals, from which compensation coefficients have not been learned, sequentially becomes smaller as the training continues. This is because, with the progress of the learning of compensation coefficients for part of the nonlinear region (i.e., as the compensation coefficients become larger), the maximum amplitude of the feedback signals becomes sequentially larger. Note however that a long time may be needed to obtain sufficiently accurate compensation coefficients because the unlearned region exists until the middle of the training.

On the other hand, in the case where gain control is applied to the feedback signals by the gain control unit 12, the maximum amplitude of the feedback signals comes close to that of the input signals input to the pre-distorter 11 (preferably, the two match each other) even in the early stage of the training. In this case, the learning unit 13 is able to learn compensation coefficients from a larger part of the dynamic range of the input signals (preferably, from the entire dynamic range of the input signals) compared to the case where no gain control is applied. Because the unlearned region is reduced (preferably, eliminated) from the early stage of the training, the learning of compensation coefficients is made more efficient, thereby shortening the training time.

Note that in the case where gain control by the gain control unit 12 has been applied, the learning unit 13 overestimates the amplification factor of the power amplifier 2 in the early stage of the training. As a result, compensation coefficients calculated by the learning unit 13 become smaller than ideal compensation coefficients. The underestimation of the compensation coefficients associated with the gain control for the feedback signals is sequentially corrected by continuing the training. Note however that because the unlearned region is smaller compared to the case where no gain control for the feedback signals is provided, it takes a shorter time to obtain sufficiently accurate compensation coefficients for the entire dynamic range of the input signals.

(b) Second Embodiment

Figure 2:
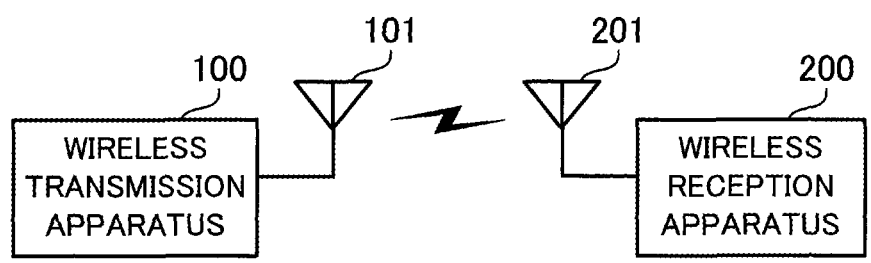
FIG. 2 illustrates a wireless communication system according to a second embodiment.

FIG. 2 illustrates a wireless communication system according to a second embodiment. The wireless communication system of the second embodiment includes a wireless transmission apparatus 100 and a wireless reception apparatus 200. The wireless transmission apparatus 100 is provided with an antenna 101, and transmits wireless signals to the wireless reception apparatus 200 by using the antenna 101. The wireless reception apparatus 200 is provided with an antenna 201, and receives wireless signals from the wireless transmission apparatus 100 by using the antenna 201.

Although the second embodiment mainly describes a transmission process of the wireless transmission apparatus 100, a wireless communication apparatus equivalent to the wireless transmission apparatus 100 may further carry out a reception process, or a wireless communication apparatus equivalent to the wireless reception apparatus 200 may further carry out the transmission process. In addition, the wireless communication system may be a one-to-many connection system in which a wireless base station communicates with multiple wireless terminals. In that case, for example, the wireless transmission apparatus 100 may be the wireless base station and the wireless reception apparatus 200 may be one of the wireless terminals. On the other hand, for example, the wireless transmission apparatus 100 may be one of the wireless terminals and the wireless reception apparatus 200 may be the wireless base station. Alternatively, at least one of the wireless transmission apparatus 100 and the wireless reception apparatus 200 may be a wireless relay apparatus.

Figure 3:
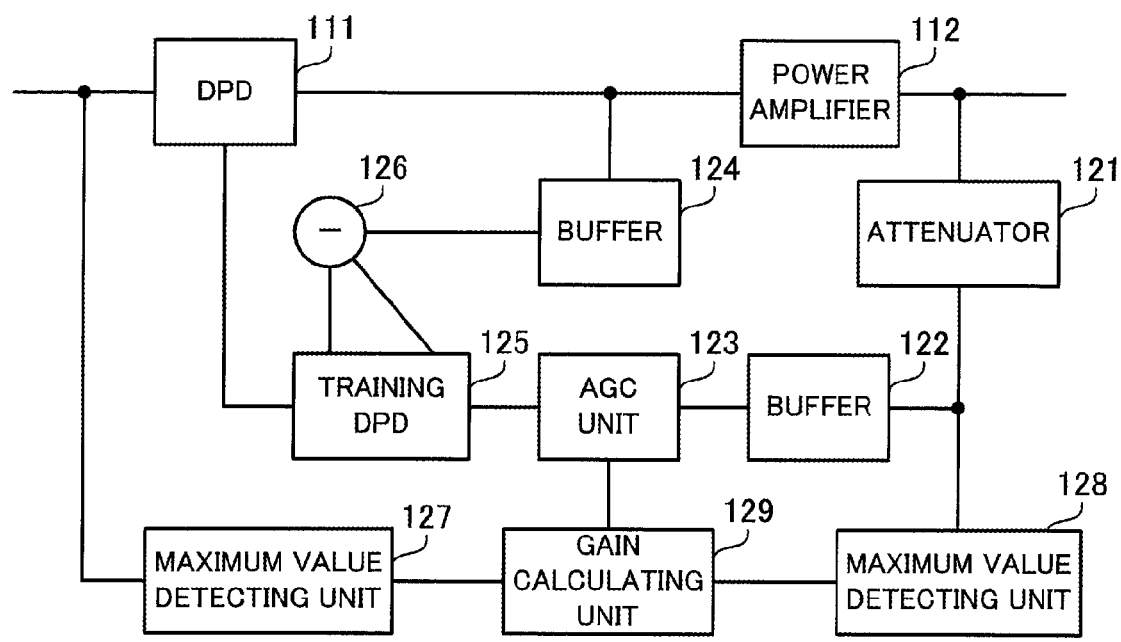
FIG. 3 is a block diagram illustrating a wireless transmission apparatus according to the second embodiment.

FIG. 3 is a block diagram illustrating a wireless transmission apparatus according to the second embodiment. The wireless transmitting apparatus 100 includes a DPD 111, a power amplifier 112, an attenuator 121, buffers 122 and 124, an AGC unit 123, a training DPD 125, a subtractor 126, maximum value detecting units 127 and 128, and a gain calculating unit 129. The DPD 111 is an example of the pre-distorter 11 of the first embodiment. An integrated assembly of the AGC unit 123, the maximum value detecting units 127 and 128, and the gain calculating unit 129 is an example of the gain control unit 12. An integrated assembly of the training DPD 125 and the subtractor 126 is an example of the learning unit 13.

The DPD 111 is a pre-distorter for carrying out digital distortion compensation for input signals to be input to the power amplifier 112. The DPD 111 has a set of compensation coefficients (hereinafter, simply referred to as a "compensation coefficient set") used for the distortion compensation. For example, the DPD 111 selects a compensation coefficient according to the amplitude of an input signal and multiplies the input signal by the selected compensation coefficient. The compensation coefficient set is stored, for example, in a lookup table where a compensation coefficient to be used is determined based on the amplitude of an input signal.

The compensation coefficient set preferably corresponds to an inverse characteristic to a nonlinear characteristic of the power amplifier 112, and is used to cancel out nonlinear distortion generated by the power amplifier 112. The compensation coefficient set is determined by training the DPD 111. In the training, N sample signals (N is an integer equal to or greater than 2) having a predetermined length are input to the DPD 111 with respect to each iteration for learning a compensation coefficient set. During the training, the DPD 111 carries out distortion compensation on the sample signals, as in the case of wirelessly communicating with the wireless reception apparatus 200.

For each learning iteration using N sample signals described above, a compensation coefficient set calculated by the training DPD 125 to be described later is copied to the DPD 111. Then, the DPD 111 carries out distortion compensation on the next N sample signals using the updated compensation coefficient set. In this manner, learning with the use of N sample signals is repeated during the training and, therefore, the compensation coefficient set is repeatedly updated. As the number of learning iterations increases, the accuracy of the compensation coefficients becomes higher. Note that, in the first learning iteration, the DPD 111 may use initial values of the compensation coefficients. The initial values of the compensation coefficients may be values having no correction for the sample signals.

Here, the number N of sample signals used in one learning iteration may be set, for example, to correspond to one wireless frame (for example, 10 ms). As the number of sample signals used in one learning iteration increases, the accuracy of the learning becomes higher. The sample signals may be randomly generated, or may be prepared in advance for the training. In the former case, individual sets of sample signals used for multiple learning iterations may be different from each other.

The power amplifier 112 amplifies input signals on which distortion compensation has been implemented by the DPD 111. A DAC may be provided between the DPD 111 and the power amplifier 112. The power amplifier 112 may be an HPA. When the wireless transmission apparatus 100 wirelessly communicates with the wireless reception apparatus 200, transmission signals amplified by the power amplifier 112 are output from the antenna 101. During the training of the DPD 111, the power amplifier 112 amplifies sample signals on which distortion compensation has been implemented by the DPD 111. Here, the power amplifier 112 has such a nonlinear amplification characteristic that the amplitude of input signals has a nonlinear relationship with that of output signals. Therefore, if no distortion compensation is implemented by the DPD 111, the amplified output signals may have nonlinear distortion.

During the training, the attenuator 121 attenuates signals output from the power amplifier 112 and, then, provides the attenuated output signals as feedback signals. An analog digital converter (ADC) may be provided posterior to the attenuator 121. The attenuator 121 multiplies the amplitude of the signals output from the power amplifier 112 by a real number. The attenuation rate of the attenuator 121 may be preliminarily set to a fixed value. For example, the magnification factor of the amplitude used by the attenuator 121 may be the reciprocal of an ideal amplification factor obtained when the amplification characteristic of the power amplifier 112 is linearized.

In each learning iteration, the buffer 122 temporarily stores therein feedback signals (corresponding to the N sample signals) provided by the attenuator 121. As the buffer 122, a volatile or non-volatile semiconductor memory may be used. The buffer 122 delays delivery of the feedback signals to the AGC unit 123 while the gain calculating unit 129 calculates a feedback gain to be used in the current learning iteration, as to be described later.

Once the gain calculating unit 129 calculates the feedback gain to be used in the current learning iteration, the AGC unit 123 applies gain control to the feedback signals stored in the buffer 122 according to the calculated feedback gain. For example, the AGC unit 123 multiplies the individual feedback signals by the calculated feedback gain, thereby achieving multiplication of the amplitude of the feedback signals by a real number. The same feedback gain is applied to the multiple feedback signals used in one learning iteration. In a different learning iteration, a different feedback gain may be applied. In an early stage of the training, the feedback gain is generally larger than 1 and, therefore, the amplitude of the feedback signals having passed through the AGC unit 123 becomes larger than that of the feedback signals before entering the AGC unit 123.

In each learning iteration, the buffer 124 temporarily stores therein input signals (corresponding to the N sample signals) which have undergone distortion compensation of the DPD 111 but have yet to be input to the power amplifier 112. As the buffer 124, a volatile or non-volatile semiconductor memory may be used. The buffer 124 delays delivery of the input signals to the subtractor 126 while the gain calculating unit 129 calculates the feedback gain to be used in the current learning iteration.

During the training, the training DPD 125 learns a compensation coefficient set by carrying out distortion which is the same as the pre-distortion made by the DPD 111. In view of this, it may be said that the training DPD 125 operates as a post-distorter. Specifically, the training DPD 125 has the same compensation coefficient set as the DPD 111 at the start of the first learning iteration using the N sample signals. The compensation coefficient set is stored, for example, in a lookup table where compensation coefficients are determined based on the amplitude of the individual signals.

In a single learning iteration, the training DPD 125 carries out distortion compensation on the feedback signals acquired from the AGC unit 123 and, then, outputs the feedback signals with distortion compensated to the subtractor 126. For example, the training DPD 125 selects a compensation coefficient according to the amplitude of each of the feedback signals acquired from the AGC unit 123, and multiplies the feedback signal by the selected compensation coefficient. Subsequently, the training DPD 125 acquires, from the subtractor 126, information indicating errors of the feedback signals with distortion compensated. Then, the training DPD 125 updates its owned compensation coefficient set based on the errors.

For example, the training DPD 125 calculates the root mean square of the errors, and updates its owned compensation coefficient set in such a manner as to minimize the overall error based on the least mean square (LMS) algorithm. Then, when a single learning iteration using the N sample signals is finished, the compensation coefficient set of the training DPD 125 is copied to the DPD 111. During the training, such learning of a compensation coefficient set is repeated. The iteration count may be preliminarily set to a fixed number, or may be adaptively determined according to the errors calculated by the subtractor 126. Note that the above-described learning method is sometimes referred to as the indirect learning architecture.

The subtractor 126 acquires the feedback signals with distortion compensated from the training DPD 125, and also acquires input signals corresponding to the feedback signals from the buffer 124. The subtractor 126 compares the input signals and the feedback signals to calculate their differences, and notifies the training DPD 125 of the calculated differences as linearization errors.

In each learning iteration, the maximum value detecting unit 127 acquires input signals (sample signals) to be input to the DPD 111, and detects the maximum amplitude of the input signals. The maximum amplitude is a maximum value of the amplitude of the N input signals, and one maximum amplitude value is obtained for each learning iteration.

In each learning iteration, the maximum value detecting unit 128 acquires feedback signals from the attenuator 121, and detects the maximum amplitude of the feedback signals. The maximum amplitude is a maximum value of the amplitude of the N feedback signals, and one maximum amplitude value is obtained for each learning iteration.

The gain calculating unit 129 calculates a feedback gain to be used by the AGC unit 123, based on the maximum amplitude of the input signals detected by the maximum value detecting unit 127 and the maximum amplitude of the feedback signals detected by the maximum value detecting unit 128. The feedback gain is calculated for each learning iteration. According to the second embodiment, the feedback gain is obtained by dividing the maximum amplitude of the input signals by the maximum amplitude of the feedback signals. With this, the maximum amplitude of the feedback signals subjected to gain control matches the maximum amplitude of the input signals. As to be described later, the feedback gain calculated by the gain calculating unit 129 becomes larger than 1 because, in an early stage of the training, the maximum amplitude of the feedback signals is smaller than that of the input signals.

Note that the attenuator 121, the AGC unit 123, the training DPD 125, the subtractor 126, the maximum value detecting units 127 and 128, and the gain calculating unit 129 may be caused to operate only during the training, and may be stopped from operating when the wireless transmission apparatus 100 wirelessly communicates with the wireless reception apparatus 200.

Figure 4:
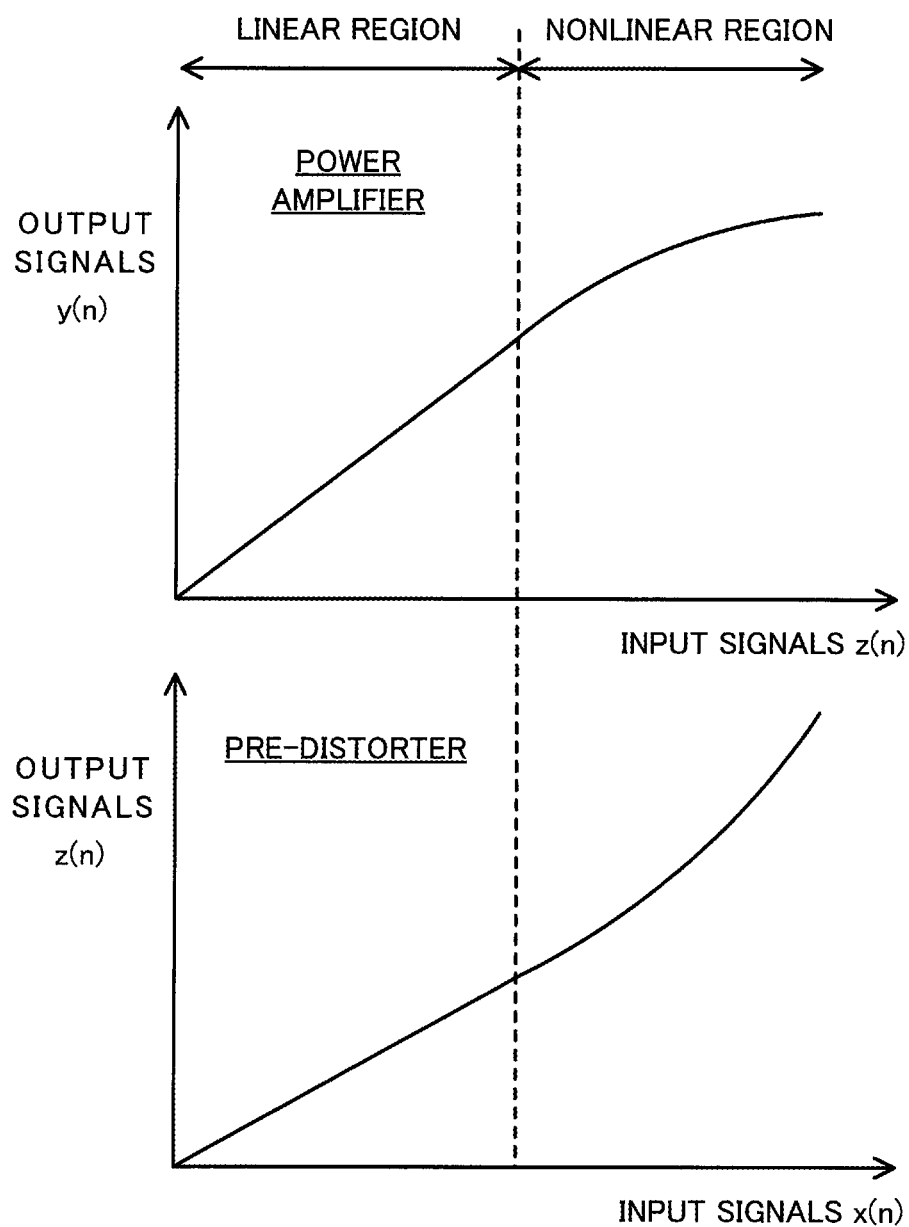
FIG. 4 is a graph illustrating a characteristic example of a power amplifier and a pre-distorter.

Next described are characteristics of the DPD 111 and the power amplifier 112 and the role of the AGC unit 123. FIG. 4 is a graph illustrating a characteristic example of a power amplifier and a pre-distorter. The amplification characteristic of the power amplifier 112 is substantially linear in a region where the amplitude of input signals is small (a linear region). That is, when the amplitude of input signals is small, the amplification factor is substantially constant, resulting in a linear relationship between the amplitude of input signals and that of output signals. On the other hand, the amplification characteristic of the power amplifier 112 is nonlinear in a region where the amplitude of input signals is large (a nonlinear region). That is, the amplification factor is not maintained constant and varies according to the amplitude of input signals as the amplitude of input signals becomes large, resulting in a nonlinear relationship between the amplitude of input signals and that of output signals. In general, the amplification factor is smaller in the nonlinear region than in the linear region, and the amplification factor decreases more as the amplitude of input signals becomes larger. In order to achieve efficient amplification, input signals corresponding to the nonlinear region are also input to the power amplifier 112.

The DPD 111 preferably produces distortion on input signals in such a manner as to cancel out the nonlinear amplification characteristic of the power amplifier 112, allowing the amplification characteristic of the power amplifier 112 to be linearized. The gain characteristic of the DPD 111 is substantially linear in a region where the amplitude of input signals is small (a linear region), as in the case of the amplification characteristic of the power amplifier 112. In the linear region, the amplitude of output signals does not have to be changed much from the amplitude of input signals. On the other hand, in a region where the amplitude of input signals is large, the gain characteristic of the DPD 111 is nonlinear according to the nonlinear amplification factor of the power amplifier 112 (a nonlinear region). Contrary to the case of the power amplifier 112, the gain becomes larger in the nonlinear region than in the linear region, and the magnification factor of the amplitude increases more as the amplitude of the input signals becomes larger.

Figure 5:
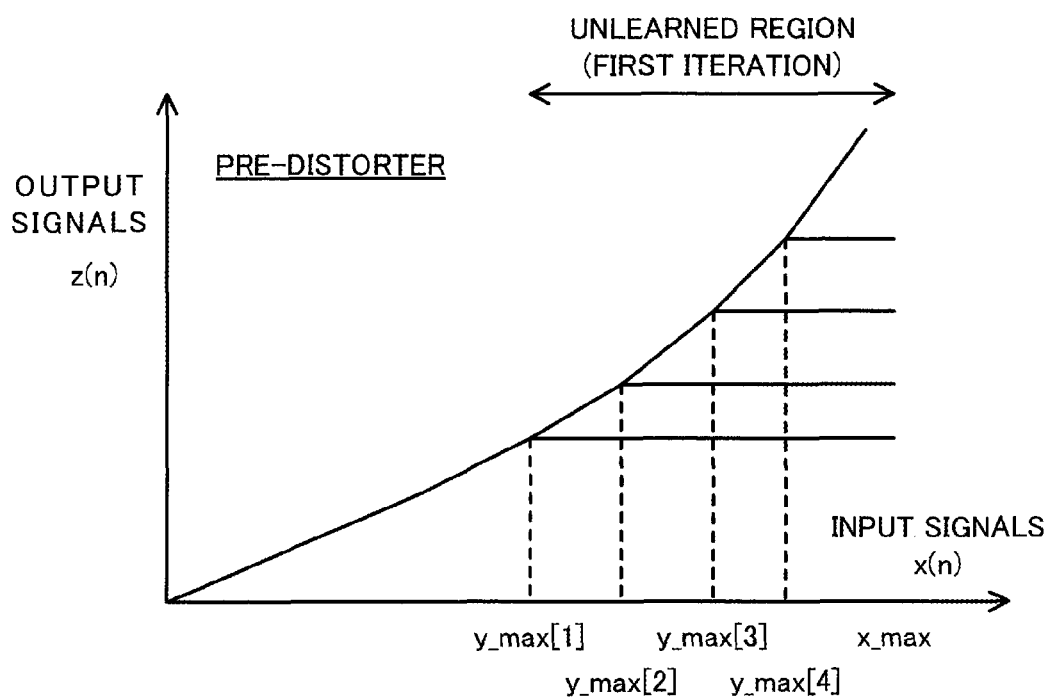
FIG. 5 is a graph illustrating a first learning example of the pre-distorter.

FIG. 5 is a graph illustrating a first learning example of the pre-distorter. First, the case where no gain control by the AGC unit 123 is applied to feedback signals is considered. In the first iteration for learning compensation coefficients, distortion compensation of the DPD 11 is practically not implemented. Therefore, the amplification factor of output signals output from the power amplifier 112 to input signals input to the DPD 111 becomes lower than an ideal amplification factor (i.e., an amplification factor in the linear region) in the nonlinear region. If the attenuator 121 attenuates the output signals by the reciprocal of the ideal amplification factor, the maximum amplitude of the feedback signals acquired by the training DPD 125 becomes smaller than the maximum amplitude of the input signals.

Here, the maximum amplitude of the feedback signals in the $M^{th}$ learning iteration is denoted as y_max[M], and the maximum amplitude of the input signals input to the DPD 111 is denoted as x_max. In the first learning iteration, the training DPD 125 updates compensation coefficients for a region where the amplitude is equal to and less than y_max[1], which is the dynamic range of the feedback signals. On the other hand, the training DPD 125 does not update compensation coefficients for a region where the amplitude is larger than y_max[1] and equal to and less than x_max. The region for which no compensation coefficients are updated may be referred to as the unlearned region. Since the compensation coefficients calculated by the training DPD 125 are copied to the DPD 111, the region where the amplitude is larger than y_max[1] and equal to and less than x_max becomes an unlearned region also for the DPD 111.

In the second iteration for learning compensation coefficients, distortion compensation is carried out on input signals using the compensation coefficient set including the unlearned region. Here, several methods may be considered for processing input signals belonging to the unlearned region. For example, the DPD 111 converts the amplitude of input signals belonging to the unlearned region to a fixed value of the maximum amplitude of output signals in the learned region (for example, the amplitude of an output signal for the case where the amplitude of an input signal is y_max[1]). In addition, for example, assuming that the amplification characteristic of the unlearned region is linear, the DPD 111 increases the amplitude of input signals belonging to the unlearned region by the maximum magnification of the learned region (for example, by the magnification for the case where the amplitude of an input signal is y_max[1]).

Because the learned region includes part of the nonlinear region, compensation coefficients of the DPD 111 become large for at least part of the nonlinear region. As a result, the maximum amplitude of the feedback signals in the second learning iteration becomes larger than that in the first learning iteration. That is, y_max[1]<y_max[2], and the unlearned region of the DPD 111 becomes smaller. In a similar fashion, by repeating the learning of compensation coefficients, the maximum amplitude of the feedback signals becomes larger in a stepwise manner like y_max[2]<y_max[3]<y_max[4] while the unlearned region of the DPD 111 becomes smaller in a stepwise manner. Eventually, the maximum amplitude of the feedback signals substantially matches x_max and there is no more unlearned region for the DPD 111. Note however that because compensation coefficients for higher amplitude are not learned until the middle of the training, the training takes a long time to increase the accuracy of the compensation coefficients.

Figure 6:
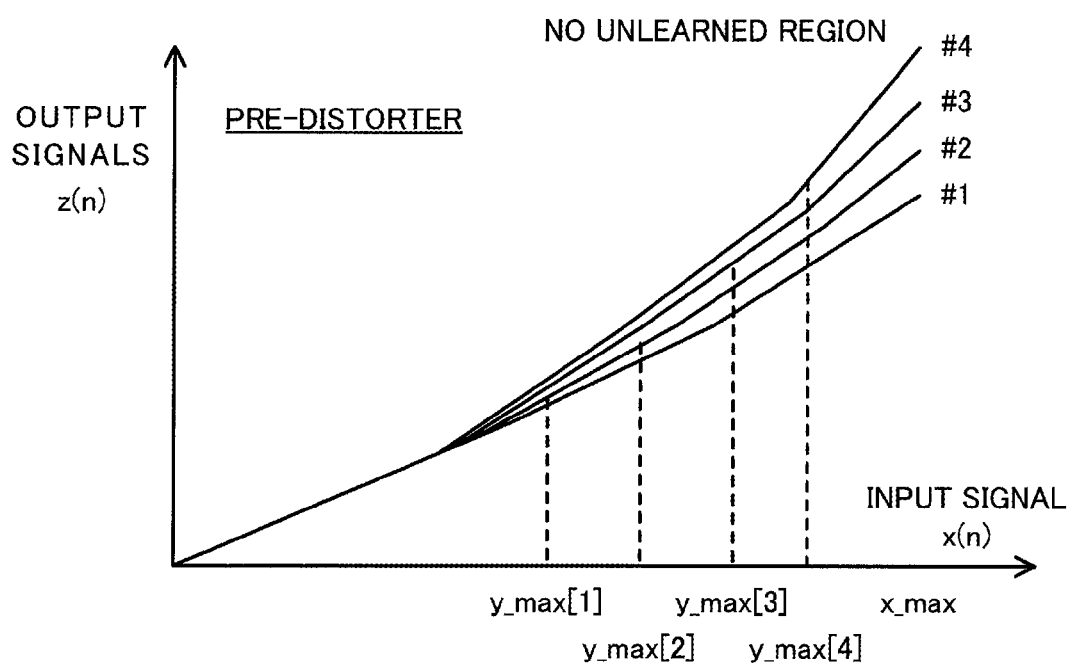
FIG. 6 is a graph illustrating a second learning example of the pre-distorter.

FIG. 6 is a graph illustrating a second learning example of the pre-distorter. Next, the case where gain control by the AGC unit 123 is applied to feedback signals is considered. As described above, in the first iteration for learning compensation coefficients, the maximum amplitude of the feedback signals provided by the attenuator 121 is smaller than the maximum amplitude of the input signals. In order to resolve the difference in the maximum amplitude, the gain calculating unit 129 calculates, as a feedback gain, the ratio of the maximum amplitude of the feedback signals in the first learning iteration to the maximum amplitude of the input signals in the first learning iteration. The AGC unit 123 increases the amplitude of the feedback signals in the first learning iteration by the magnification of the calculated feedback gain.

Herewith, the maximum amplitude of the feedback signals acquired by the training DPD 125 in the first learning iteration is corrected from y_max[1] to x_max. As a result, the training DPD 125 is able to update compensation coefficients for the entire dynamic range of the input signals where the amplitude is equal to and less than x_max, and thus no unlearned region is present. In a similar fashion, the compensation coefficients are updated for the entire dynamic range of the input signals from the second learning iteration onward.

Note that the amplitude of the feedback signals being increased by the AGC unit 123 means that the training DPD 125 overestimates the amplification factor of the power amplifier 112. Therefore, in an early stage of the training, the training DPD 125 calculates such compensation coefficients smaller than ideal compensation coefficients that the amplitude of the input signals with distortion compensated is kept small. The difference between the distortion compensation coefficients is resolved in a stepwise manner by repeating the compensation coefficient learning. Note however that, because no unlearned region is present from the first learning iteration, it is possible to reduce the training time needed to sufficiently improve the accuracy of the compensation coefficients compared to the case in FIG. 5.

Figure 7:
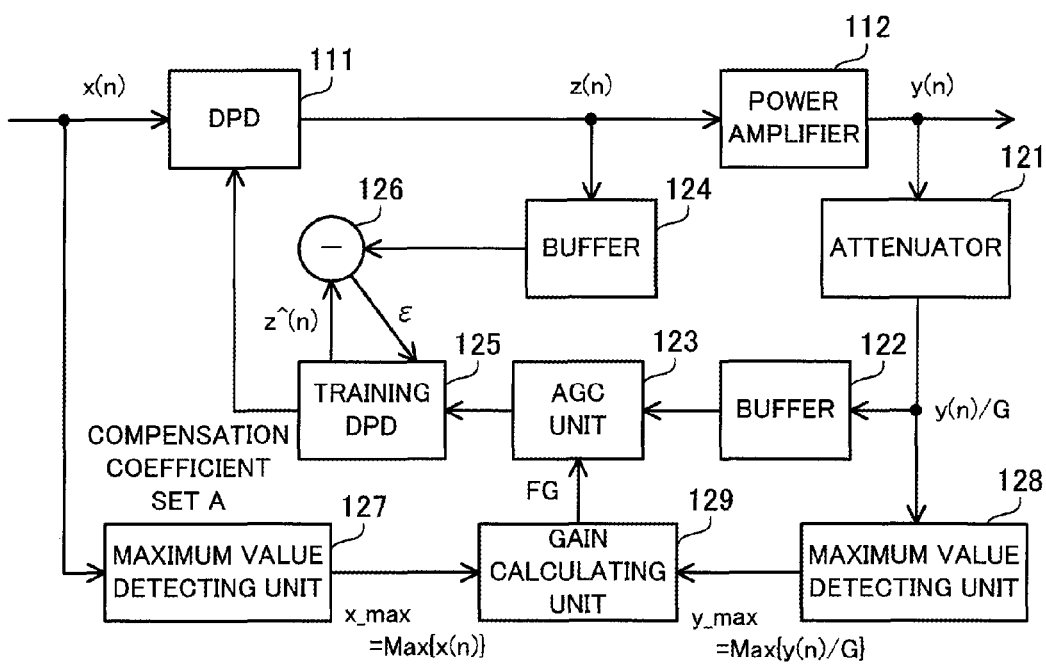
FIG. 7 illustrates flows of signals in the wireless transmission apparatus.

Next described are flows of signals in the wireless transmission apparatus 100. FIG. 7 illustrates flows of signals in a wireless transmission apparatus. For each iteration for learning compensation coefficients, signals x(n) (n is an integer from 1 to N) are input to the DPD 111 as N sample signals. The DPD 111 applies compensation coefficients to the signals x(n) to thereby output signals z(n). The signals z(n) are provided to the power amplifier 112, and also temporarily held in the buffer 124. The power amplifier 112 amplifies the signals z(n) to thereby output signals y(n). An ideal amplification factor obtained when the amplification characteristic of the power amplifier 112 is linearized is denoted as amplification factor G. The attenuator 121 decreases the amplitude of the signals y(n) output from the power amplifier 112 at an attenuation rate of 1/G to thereby output signals y(n)/G. The signals y(n)/G are provided to the maximum value detecting unit 128, and also temporarily held in the buffer 122.

The maximum value detecting unit 127 acquires the signals x(n) to be input to the DPD 111, and detects the maximum amplitude x_max of the signals x(1) to x(N) which are N input signals. The maximum value detecting unit 128 acquires the signals y(n)/G from the attenuator 121, and detects the maximum amplitude y_max of the signals y(1)/G to y(N)/G which are N feedback signals. The gain calculating unit 129 calculates a feedback gain FG obtained by dividing the maximum amplitude x_max by the maximum amplitude y_max (FG=x_max÷y_max). The AGC unit 123 applies the feedback gain FG to the signals y(n)/G held in the buffer 122 to thereby provide signals y(n)·FG/G to the training DPD 125.

The training DPD 125 applies compensation coefficients to the signals y(n)·FG/G to thereby output signals $\hat{z}(n)$. When the input of the N sample signals is started, the training DPD 125 has a compensation coefficient set A which is the same as a compensation coefficient set held by the DPD 111. The subtractor 126 calculates errors E by subtracting the signals $\hat{z}(n)$ output from the training DPD 125 from the signals z(n) held in the buffer 124. The training DPD 125 uses the LMS algorithm with the errors E associated with the N sample signals to thereby update the compensation coefficient set A. Subsequently, the training DPD 125 copies the compensation coefficient set A to the DPD 111.

Figure 8:
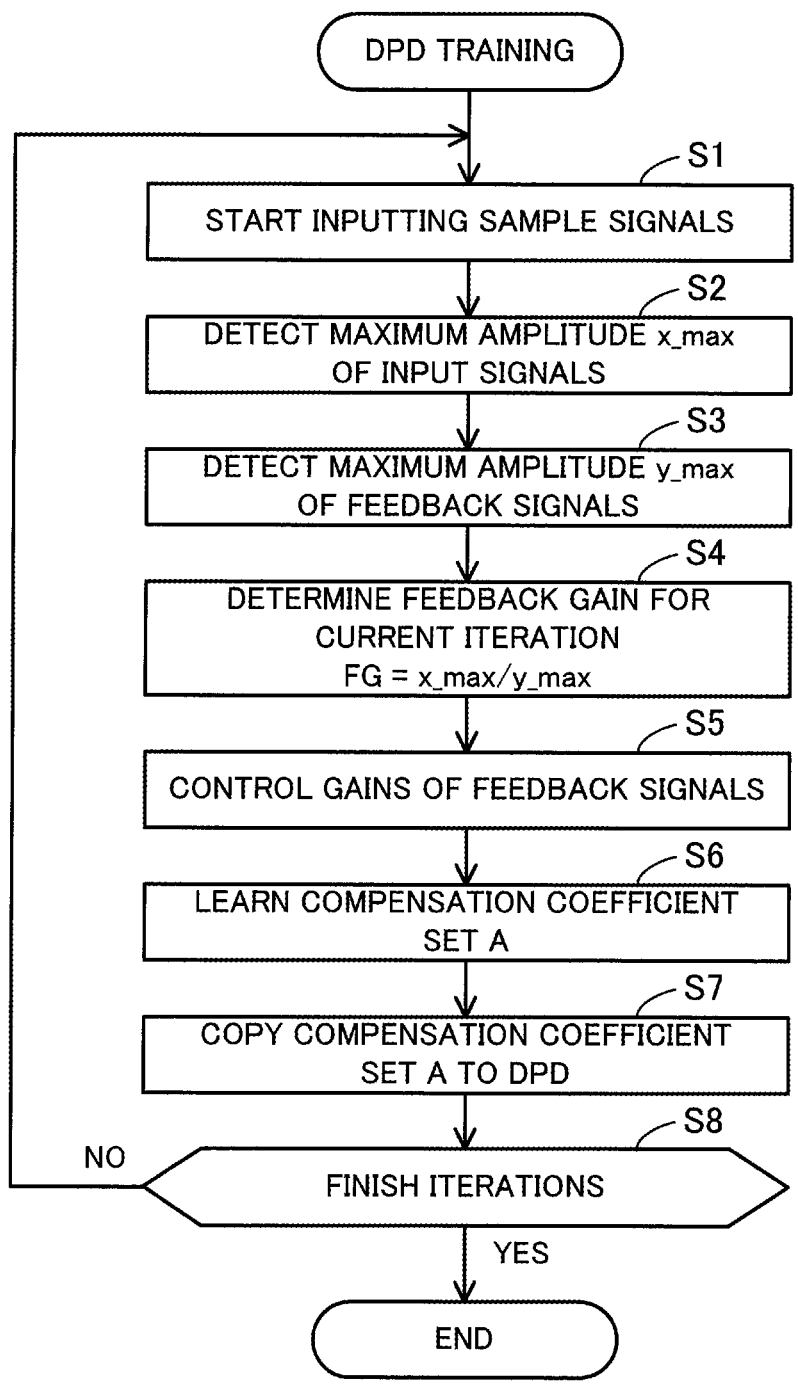
FIG. 8 is a flowchart illustrating an example of a DPD training procedure.

Next described is a procedure for training the DPD 111. FIG. 8 is a flowchart illustrating an example of a DPD training procedure.

(S1) The wireless transmission apparatus 100 starts inputting N sample signals to the DPD 111. The sample signals are, for example, randomly generated signals corresponding to one wireless frame. The DPD 111 carries out distortion compensation on the N input signals which are sample signals. The power amplifier 112 amplifies the N input signals with distortion compensated. The attenuator 121 attenuates outputs of the power amplifier 112 at a predetermined attenuation rate to thereby obtain N feedback signals.

(S2) The maximum value detecting unit 127 monitors input signals entering the DPD 111, and then detects a maximum amplitude value (the maximum amplitude x_max) of the N input signals. The maximum amplitude x_max is determined after all the N input signals are supplied to the DPD 111.

(S3) The maximum value detecting unit 128 monitors feedback signals output from the attenuator 121, and then detects a maximum amplitude value (the maximum amplitude y_max) of the N feedback signals. The maximum amplitude y_max is determined after all the N feedback signals are generated.

(S4) The gain calculating unit 129 determines the feedback gain FG to be used in the current learning iteration, based on the maximum amplitude x_max detected in step S2 and the maximum amplitude y_max detected in step S3. The feedback gain FG is obtained by dividing the maximum amplitude x_max by the maximum amplitude y_max (FG=x_max y_max). Note that at the time when the feedback gain FG is determined, the N feedback signals are stored in the buffer 122 and the N input signals are stored in the buffer 124.

(S5) Based on the feedback gain FG determined in step S4, the AGC unit 123 applies gain control to the N feedback signals stored in the buffer 122. That is, the AGC unit 123 multiplies the amplitude of each of the feedback signals by the feedback gain FG. With this, the original dynamic range of the feedback signals (the amplitude range up to y_max) is expanded to the dynamic range of the input signals before the distortion compensation (the amplitude range up to x_max).

(S6) The training DPD 125 updates the compensation coefficient set A using the N feedback signals subjected to the gain control in step S5. That is, the training DPD 125 carries out distortion compensation on the feedback signals using its owned compensation coefficient set A (the same as that of the DPD 111). The subtractor 126 calculates errors between the feedback signals with distortion compensated and the input signals with distortion compensated, which input signals are stored in the buffer 124. The training DPD 125 applies a predetermined algorithm to the errors associated with the N feedback signals to thereby calculate such a compensation coefficient set A as to minimize the errors.

(S7) The training DPD 125 copies the compensation coefficient set A updated in step S6 to the DPD 111. With this, one iteration for learning the compensation coefficient set A is finished. In the following learning iteration, the updated compensation coefficient set A is used.

(S8) The wireless transmission apparatus 100 determines whether to finish the iterations for learning the compensation coefficient set A, that is, whether to finish the training of the DPD 111. The iteration number for learning the compensation coefficient set A may be preliminarily set to a fixed value, or may be dynamically determined according to the convergence condition of the compensation coefficient set A. In the case of repeating the learning of the compensation coefficient set A, the wireless transmission apparatus 100 proceeds to step S1. If not, the wireless transmission apparatus 100 ends the training of the DPD 111.

Figure 9:
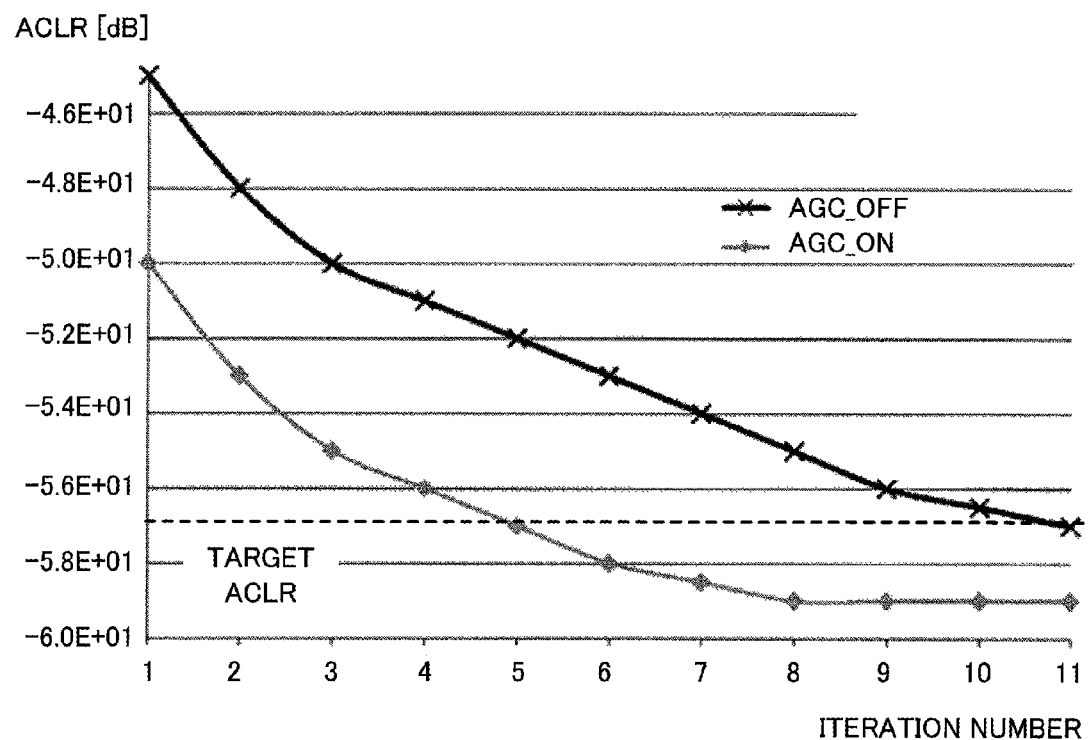
FIG. 9 is a graph illustrating an example of change in adjacent channel leakage power.

FIG. 9 is a graph illustrating an example of change in adjacent channel leakage power. The graph illustrates an example of change in the adjacent channel leakage ratio (ACLR) of the signals y(n) output from the power amplifier 112 when the learning of compensation coefficients is repeated. The ACLR is the ratio of the power leaked into adjacent frequency channels to the power in an intended frequency channel where transmission is allowed.

The ACLR becomes larger as the nonlinear distortion caused when the power amplifier 112 amplifies input signals is larger, and the ACLR becomes smaller as the accuracy of the distortion compensation achieved by the DPD 111 is higher (i.e., as the accuracy of the learned compensation coefficients is higher). An increase in the iteration number for learning compensation coefficients provides higher accuracy of the compensation coefficients (i.e., provides compensation coefficients closer to ideal ones), thus decreasing the ACLR.

Assume here that a target ACLR is −5.7E+01 dB, and that the learning of compensation coefficients is repeated until the ACLR becomes at least smaller than the target ACLR. According to the example of FIG. 9, in the case where no gain control by the AGC unit 123 is applied (AGC_OFF), the ACLR becomes smaller than the target ACLR at last in the eleventh learning iteration. On the other hand, in the case where gain control by the AGC unit 123 is applied (AGC_ON), the ACLR becomes smaller than the target ACLR in the fifth learning iteration. This indicates that the gain control by the AGC unit 123 yields faster convergence of compensation coefficients, resulting in a shorter training time. In addition, the gain control by the AGC unit 123 efficiently improves communication quality within a limited training time.

According to the wireless transmission apparatus 100 of the second embodiment, the maximum amplitude of the feedback signals used in the learning of compensation coefficients matches the maximum amplitude of the input signals even in an early stage of the training. Therefore, it is possible to resolve the problem of an unlearned region from the early stage of the training, which allows the learning of compensation coefficients for the entire dynamic range of the input signals. With this, the compensation coefficients converge faster, thus resulting in a shorter training time. In addition, it is possible to efficiently improve the accuracy of the compensation coefficients within a limited training time. This reduces power leakage into adjacent channels, contributing to an improvement in communication quality of the wireless transmission apparatus 100.

According to one aspect, it is possible to reduce the training time of the pre-distorter.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A distortion compensation apparatus for compensating nonlinear distortion of a power amplifier, comprising:
a pre-distorter configured to add distortion according to compensation coefficients to individual input signals prior to the input signals being input to the power amplifier;
a gain control unit configured to apply gain control to individual feedback signals according to a maximum level of the feedback signals within a time frame, the feedback signals being fed back from the power amplifier; and
a learning unit configured to update the compensation coefficients used by the pre-distorter, using the feedback signals subjected to the gain control.

2. The distortion compensation apparatus according to claim 1, wherein
the gain control unit determines a gain to be applied to the feedback signals based on the maximum level of the feedback signals and a maximum level of the input signals within the time frame.

3. The distortion compensation apparatus according to claim 2, wherein
the gain control unit determines the gain in such a manner that the maximum level of the feedback signals matches the maximum level of the input signals.

4. The distortion compensation apparatus according to claim 1, wherein the learning unit updates the compensation coefficients based on the feedback signals subjected to the gain control and the input signals with the distortion added thereto.

5. A distortion compensation method for compensating nonlinear distortion of a power amplifier using a pre-distorter, the distortion compensation method comprising:
applying gain control to individual feedback signals according to a maximum level of the feedback signals within a time frame, the feedback signals being fed back from the power amplifier; and
updating compensation coefficients to be applied by the pre-distorter to individual input signals prior to the input signals being input to the power amplifier, using the feedback signals subjected to the gain control.

* * * * *